United States Patent [19]

Russell et al.

[11] 3,974,456

[45] Aug. 10, 1976

[54] AMPLIFIER OUTPUT STAGE

[75] Inventors: Ronald W. Russell, Sunnyvale; Kyle M. Black, San Jose, both of Calif.

[73] Assignee: National Semiconductor Corporation, Santa Clara, Calif.

[22] Filed: Feb. 12, 1975

[21] Appl. No.: 549,197

[52] U.S. Cl. ............................... 330/35; 330/15; 330/18; 330/22
[51] Int. Cl.² .......................................... H03F 3/16
[58] Field of Search ................ 330/15, 18, 22, 35

[56] References Cited
UNITED STATES PATENTS
3,776,410   10/1973   Elsaesser.......................... 330/15 X

*Primary Examiner*—R. V. Rolinec
*Assistant Examiner*—Lawrence J. Dahl
*Attorney, Agent, or Firm*—Lowhurst & Aine

[57] ABSTRACT

An output stage for an amplifier operating under capacitive loading conditions includes an FET-bipolar composite connected between its input and its output and an emitter follower connected in parallel with the FET. A current source and current tracking circuit maintains the emitter follower conductive at all times, such that relatively high frequency input signals are supplied to the output through the emitter follower. When the output stage is sourcing current to the load, the signal path is through the emitter follower. When the output stage is sinking current from the load, the signal path is primarily through the FET when relatively low frequency input signals are connected thereto and the signal path is primarily through the emitter follower when relatively high frequency input signals are connected thereto.

6 Claims, 1 Drawing Figure

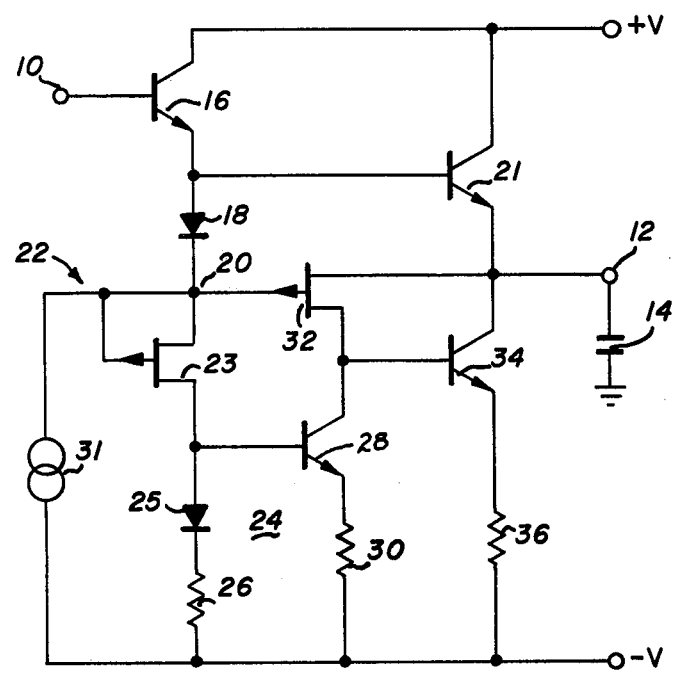

AMPLIFIER OUTPUT STAGE

BACKGROUND OF THE INVENTION

1. FIELD OF THE INVENTION

This invention relates generally to amplifier circuits, and more particularly to an output stage for an amplifier having capacitive loading.

2. PRIOR ART

A typical class A-B output stage under capacitive loading employs an NPN transistor for sourcing a current to the load and a PNP transistor for sinking current from the load. Generally, PNP transistors produce a relatively large phase shift when sinking current from the load. These large phase shifts limit the overall loop stability and bandwidth of the amplifier.

Accordingly, it can be appreciated that a need exists for an amplifier output stage which is capable of sinking current from a capacitive load without producing a relatively large phase shift.

SUMMARY OF THE INVENTION

An object of the present invention is to provide an output stage for an amplifier which is capable of sinking current from a capacitive load without producing a relatively large phase shift.

Another object of the present invention is to provide an output stage for an amplifier which is capable of sinking current from a capacitive load and has a bandwidth which is approximately ten times greater than the bandwidth of prior known output stages operating under similar conditions.

These and other objects of the present invention are attained by an output stage for an amplifier which includes a field effect transistor (FET) for biasing a bipolar transistor which is operative to sink current from the capacitive load, and a feed forward circuit providing a high frequency path around the FET-bipolar composite pull down circuit.

This arrangement provides a bandwidth which is approximately ten times greater than the bandwidth of prior known output stages operating under similar conditions.

The invention, however, as well as other objects, features and advantages thereof will be more full realized and understood from the following detailed description, when taken in conjunction with the accompanying drawing, wherein:

BRIEF DESCRIPTION OF THE DRAWING

The single FIGURE is a schematic diagram of an amplifier output stage which is operating under capacitive loading and is constructed in accordance with the principles of the present invention.

DETAILED DESCRIPTION OF THE PREFERRED EMBODIMENT

With reference to the drawing in detail, there is shown an amplifier output stage having an input terminal 10 and an output terminal 12. A capacitor 14 represents a load connected to the output terminal 12.

The input terminal 10 is connected to the base of a transistor 16 connected as an emitter-follower, with its collector connected to the positive supply voltage and its emitter connected through a diode 18 to a circuit point 20. The emitter of the transistor 16 is also connected to the base of a transistor 21 which is also connected as an emitter-follower, with its collector connected to the positive supply voltage and its emitter connected to the output terminal 12. The diode 18 and the transistor 21 are matched devices, such that the current through the diode 18 will be equal to the current through the transistor 21 when the voltage drop across the diode 18 is equal to the base-emitter voltage of the transistor 21.

A circuit which is generally designated with the reference numeral 22 maintains the base-emitter voltage of the transistor 21 equal to the voltage drop across the diode 18, such that the current through the transistor 21 is equal to the current through the diode 18. The circuit 22 includes an FET 23 having its source and gate connected to the circuit point 20, such that it forms a current source. The circuit 22 also includes a current mirror which is generally designated with the reference numeral 24. The current mirror 24 includes a diode 25 and resistor 26 in one branch thereof which are connected in series with one another to the negative voltage supply, and a transistor 28 and resistor 30 in the other branch thereof which are connected in series with one another to the negative voltage supply. The current mirror 24 maintains the current in one branch thereof proportional to the current in the other branch thereof, such that these currents will track one another. The circuit 22 also includes a current source 31 connected between the circuit point 20 and the negative supply voltage.

The circuit point 20 is also connected to the gate of an FET 32 which has its source connected to the output terminal 12 and its drain connected to the collector of the transistor 28 and to the base of a transistor 34. The collector of the transistor 34 is connected to the terminal 12 and its emitter is connected through a resistor 36 to the negative supply voltage.

The transistor 21 forms a feed forward loop around the FET 32. The feed forward transistor 21 effectively forms a high frequency path around the FET 32, thereby eliminating phase shifting problems which would otherwise occur. The transistor 21 performs this function by virtue of its continuance conduction. Such conduction of the transistor 21 is maintained by the circuit 22 maintaining a substantially constant gate-source voltage on the FET 32. In the following discussion, the $I_{DSS}$ of the FET's 23 and 32 is that current which is provided at the drain of each FET when its gate-source voltage is equal to zero.

During quiescent conditions, if it is assumed that the current through the resistor 30 is equal to the current through the resistor 26 and if the FET's 22 and 32 are matched, such that their $I_{DSS}$'s are equal, then the current through the diode 18 is equal to the current through the current source 31 plus the drain current of the FET 23. The drain current of the FET 23, which is equal to its $I_{DSS}$, establishes the current through the transistor 28 which, neglecting the relatively small current into the base of the transistor 34, is equal to the $I_{DSS}$ of the FET 32 because of the function of the current mirror 24. Accordingly, the quiescent bias on the FET 32 will be equal to zero.

Since the gate-source voltage of the FET 32 is equal to zero, the base-emitter voltage of the transistor 21 will be equal to the voltage drop across the diode 18. Since the diode 18 and the transistor 21 are matched, the current through the transistor 21 will be equal to the current through the diode 18. Accordingly, the current through the transistor 21 will be equal to the current through the FET 32 plus the current through the current source 31. From inspection, it can be appreciated that the current through the transistor 21 is equal to the current through the FET 32 plus the current through the transistor 34. Accordingly, under quiescent conditions, the current through the transistor 34 is equal to the current through the current source 31. From the above, it can be appreciated that the current through the transistor 21 is always greater than the $I_{DSS}$ of the FET 32.

When a low frequency signal is supplied to the terminal 10 such that current is sourced to the load 14 and supplied out of the terminal 12, the emitter followers 16 and 21 provide that current to the load 14. When a low frequency signal is supplied to the terminal 10 such that current is supplied into the terminal 12 from the load 14, the following conditions will exist. The circuit point 20 will become more negative, thereby providing a forward bias to the FET 32 which will be sufficient to increase the conduction of the transistor 34, thereby permitting the transistor 34 to sink current flowing into the output terminal 12.

If a relatively high frequency signal is supplied to the terminal 10, the relatively slow response of the FET 32 will not permit a rapid change of the current therethrough. However, because of the continuous conduction of the transistor 21, the relatively high frequency input signal will be supplied to its emitter to alter the potential on the output terminal 12. Without the circuit 22, the transistor 21 would not be continuously conductive, since its base-emitter function would become reverse biased by the increased source-gate voltage on the FET 32. It can be appreciated, therefore, that the circuit 22 maintains the source-gate voltage of the FET 32 substantially constant under normal and expected operating conditions, thereby keeping the transistor 21 conductive under the same conditions.

Because of the continuous conduction of the transistor 21 under normal and expected operating conditions, the phase shifting problems encountered in prior known circuits when sinking current are eliminated. Furthermore, the slow response of the FET 32 does not cause a phase shifting problem, since it is by-passed by the transistor 21 during high frequency signal conditions. Accordingly, the circuit illustrated in the drawing has a bandwidth which is ten times greater than the bandwidth of prior known output stages operating under conditions which require sinking current from a load.

The invention claimed is:

1. An amplifier output stage having at least an input and an output terminal, said stage comprising:
   a current sinking transistor having one of its collector and emitter coupled to said output terminal;
   an FET coupled between said output terminal and the base of said transistor;
   means for supplying an input signal to the gate of said FET;
   means for maintaining the gate-source voltage of said FET constant; and
   a first emitter-follower having its base coupled to said input terminal and one of its emitter and collector coupled to said output terminal.

2. The amplifier output stage of claim 1, wherein said maintaining means includes a first current source having a current therethrough which is proportional to the $I_{DSS}$ of said FET, and a current mirror having one branch thereof connected to said current source and the other branch connected to said FET.

3. The amplifier output stage of claim 2, wherein said supplying means includes a diode coupled between said input terminal and the gate of said FET, said diode and said first emitter-follower being matched such that their currents are equal when the voltage drop across aid diode is equal to the base-emitter voltage of said first emitter-follower.

4. The amplifier output stage of claim 3 further including a second-emitter-follower for connecting said input terminal to said diode and to said first emitter-follower, said second emitter-follower having its base coupled to said input terminal and having one of its collector and emitter coupled to said diode and to the base of said first emitter-follower.

5. The amplifier output stage of claim 4 further comprising a second current source connected in parallel with the serial combination of said first current source and said one branch of said current mirror.

6. The amplifier output stage of claim 4, further comprising a second current source connected in parallel with said first current source and said one branch of said current mirror in series with one another.

* * * * *